(12) United States Patent
Sakhare et al.

(10) Patent No.: US 10,325,647 B2
(45) Date of Patent: Jun. 18, 2019

(54) NON-VOLATILE SRAM CELL USING RESISTIVE MEMORY ELEMENTS

(71) Applicants: IMEC VZW, Leuven (BE); VRIJE UNIVERSITEIT BRUSSEL, Brussels (BE); Katholieke Universiteit Leuven, KU LEUVEN R&D, Leuven (BE)

(72) Inventors: Sushil Sakhare, Heverlee (BE); Trong Huynh Bao, Leuven (BE); Manu Komalan Perumkunnil, Leuven (BE)

(73) Assignees: IMEC VZW, Leuven (BE); VRIJE UNIVERSITEIT BRUSSEL, Leuven (BE); Katholieke Universiteit Leuven, KU Leuven R&D, Leuven (BE)

(*) Notice: Subject to any disclaimer, the term of this patent is extended or adjusted under 35 U.S.C. 154(b) by 106 days.

(21) Appl. No.: 15/833,802

(22) Filed: Dec. 6, 2017

(65) Prior Publication Data

US 2018/0174644 A1    Jun. 21, 2018

Related U.S. Application Data

(60) Provisional application No. 62/437,594, filed on Dec. 21, 2016.

(51) Int. Cl.
*G11C 14/00* (2006.01)
*G11C 11/417* (2006.01)
(Continued)

(52) U.S. Cl.
CPC ........ *G11C 11/417* (2013.01); *G11C 11/1659* (2013.01); *G11C 11/1673* (2013.01);
(Continued)

(58) Field of Classification Search
CPC .................. G11C 14/0081; G11C 14/0054
(Continued)

(56) References Cited

U.S. PATENT DOCUMENTS

| 7,082,053 B1* | 7/2006 | Jenne | G11C 14/0081 365/158 |
| 7,791,941 B2* | 9/2010 | Hanafi | G11C 14/0081 365/158 |

(Continued)

FOREIGN PATENT DOCUMENTS

WO    WO 2016/024527 A1    2/2016

*Primary Examiner* — Son L Mai
(74) *Attorney, Agent, or Firm* — Knobbe Martens Olson & Bear, LLP

(57) ABSTRACT

A memory cell is disclosed, comprising a static random-access memory, SRAM, bit cell, a first resistive memory element and a second resistive memory element. The first resistive memory element is connected to a first storage node of the SRAM bit cell and a first intermediate node, and the second resistive memory element connected to a second storage node of the SRAM bit cell and a second intermediate node. Each one of the first intermediate node and the second intermediate node is configured to be supplied with a first supply voltage via a first transistor and a second supply voltage via a second transistor, wherein the first transistor and the second transistor are complementary transistors separately controllable by a first word line and a second word line, respectively. Methods for operating such a memory cell are also disclosed.

11 Claims, 5 Drawing Sheets

(51) Int. Cl.
  *G11C 13/00* (2006.01)
  *G11C 11/16* (2006.01)
  *G11C 11/412* (2006.01)
  *G11C 11/419* (2006.01)

(52) U.S. Cl.
  CPC ........ *G11C 11/1675* (2013.01); *G11C 11/419* (2013.01); *G11C 11/4125* (2013.01); *G11C 13/0038* (2013.01); *G11C 14/009* (2013.01); *G11C 14/0054* (2013.01); *G11C 14/0081* (2013.01)

(58) Field of Classification Search
  USPC .................................................. 365/156, 158
  See application file for complete search history.

(56) References Cited

U.S. PATENT DOCUMENTS

| | | | | |
|---|---|---|---|---|
| 8,194,438 B2 * | 6/2012 | Ahn | ................... | G11C 14/0081 365/154 |
| 8,295,079 B2 * | 10/2012 | Yamamoto | ......... | G11C 14/0081 365/145 |
| 8,331,134 B2 * | 12/2012 | Chiu | ................. | G11C 13/0002 365/154 |
| 8,508,983 B2 * | 8/2013 | Wang | ................ | G11C 14/0054 365/148 |
| 8,942,027 B1 * | 1/2015 | Chuang | ............... | G11C 14/009 365/148 |
| 10,049,712 B2 * | 8/2018 | Yokoyama | .......... | G11C 11/1697 |
| 10,049,740 B2 * | 8/2018 | Sugahara | ........... | G11C 14/0081 |
| 2013/0308373 A1 | 11/2013 | Shukh | | |
| 2014/0355330 A1 | 12/2014 | Endoh et al. | | |
| 2016/0064077 A1 | 3/2016 | Di Pendina | | |

\* cited by examiner

NON-VOLATILE SRAM CELL USING RESISTIVE MEMORY ELEMENTS

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of of U.S. Provisional Application No. 62/437,594, filed Dec. 21, 2016. The aforementioned application is incorporated by reference herein in its entirety, and is hereby expressly made a part of this specification.

TECHNICAL FIELD

A memory cell for a static random access memory (SRAM), as well as methods for operating an SRAM, is provided.

BACKGROUND

SRAM is a type of random access memory wherein each data bit is stored on the transistors of two cross-coupled inverters. The bit cell has two stable states corresponding to a logic "1" or "0". Two additional access transistors or pass transistors may be used for controlling the access to the storage cell during read and write operations. The access transistors may be connected to the storage cell at a respective storage node. The storage nodes are complementary nodes, and a logic "1" may hence be represented by a high voltage at a first storage node and a low voltage at a second storage node. Accordingly, a logic "0" may be represented by a low voltage at the first storage node and a high voltage at the second storage node. Data may be written to the storage cell by a word line for opening the access transistors and transferring a charge from complementary bit lines to the respective storage nodes. Data may be read from the storage cell by opening the access transistors and sensing the voltage via the bit lines.

As these kinds of memory cells are volatile to their nature, it has been proposed to use programmable resistive elements, such as magnetic tunnel junctions (MTJs), to provide non-volatile data storage. The programmed resistive state is maintained even when a supply voltage of the storage cell is disconnected, and therefore data may be stored by such elements in a non-volatile fashion.

Even though such techniques have been proposed, the general trend of miniaturisation causes a continuous strive for faster and more energy efficient memory cells having a reduced area.

SUMMARY

An object of certain aspects and embodiments is accordingly to provide a faster and more energy efficient memory cell. Additional and alternative objectives may be understood from the following.

According to a first aspect, there is provided a memory device comprising:
  a static random-access memory, SRAM, bit cell;
  a first resistive memory element having a first terminal connected to a first storage node of the SRAM bit cell and a second terminal connected to a first intermediate node; and
  a second resistive memory element having a first terminal connected to a second storage node of the SRAM bit cell and a second terminal connected to a second intermediate node;
wherein
  each one of the first intermediate node and the second intermediate node is configured to be supplied with a first supply voltage via a first transistor and a second supply voltage via a second transistor; and wherein
  the first transistor and the second transistor are complementary transistors separately controllable by a first word line and a second word line, respectively.

According to a second aspect, there is provided a method in a memory cell according to the first aspect, the method comprising:
  applying a high-level voltage to the first and second word line, wherein the high-level voltage is higher than a threshold voltage of the second transistor such that:
    in case the first storage node is in a high voltage state, a current flows from the first storage node to the second supply voltage source such that the first resistive storage element is switched to a low resistance mode; and
    in case the second storage node is in a high voltage state, a current flows from the second storage node to the second supply voltage source such that the second resistive storage element is switched to a low resistance mode;
  the method further comprising:
  applying a low-level voltage to the first and second word line, wherein the low-level voltage is lower than a threshold voltage of the first transistor such that:
    in case the second storage node is in a low voltage state, a current flows from the first voltage source to the second storage node such that the second resistive memory element is switched to a high resistance state; and
  in case the first storage node is in a low voltage state, a current flows from the first voltage source to the first storage node such that the first resistive memory element is switched to a high resistance state.

According to a third aspect, there is provided a method in a memory cell according to the first aspect, comprising:
  applying a low-level voltage to the first and second word line, wherein the low-level voltage is lower than a threshold voltage of the first transistor such that the first and second storage node are charged by a current flowing from the first voltage source; wherein
    in case the first resistive memory element is in a low resistance state and the second resistive memory element is in a high resistance state, the first storage node is charged faster than the second storage node, thereby causing the SRAM bit cell to reinforce a state in which the first storage node is arranged at a high voltage state and the second storage node is arranged at a low voltage state; and
  in case the first resistive memory element is in a high resistance state and the second resistive element is in a low resistance state, the second storage node is charged faster than the first storage node, thereby causing the SRAM bit cell to reinforce a state in which the first storages node is arranged at a low voltage state and the second storage node is arranged at a high voltage state.

The SRAM bit cell may comprise two cross-coupled inverters forming a bi-stable storage cell. A logic 1 at the input of the first inverter turns into a logic 0 at its output, and may be fed into the second converter which transforms that logic 0 back to a logic 1 which is fed back to the first inverter. The input of the first inverter may be connected to the output of the second inverter at the first storage node, whereas the output of the first inverter may be connected to the input of the second inverter at the second storage node. Thus, the storage cell may be in two stable states; a first state in which the first storage node represents a logic 0 and the second storage node a logic 1, and a second state in which the first storage node represents a logic 1 and the second storage node a logic 0.

The SRAM bit cell may further comprise a first and a second access transistor for controlling the access to the storage cell during e.g. read and write operations. The first access transistor may be coupled between the first storage node and a first bit line, whereas the second access transistor may be coupled between the second storage node and a second bit line. Both access transistors may be controlled by an SRAM bit cell word line, by which the connection between the storage nodes and the bit lines may be controlled.

Each one of the intermediate nodes may be coupled between a first transistor and a second transistor, forming a complementary pair that may be connected in series between a first supply voltage and a second supply voltage. The intermediate nodes may also be referred to as floating nodes, indicating that the nodes are not fixed to a particular voltage. The first supply voltage may e.g. be a drain supply voltage, $V_{DD}$, and the second supply voltage may e.g. be ground or a source supply voltage, $V_{SS}$. The first transistor and the second transistor may be separately controlled by a respective first and second word line, allowing the connection of the intermediate node to the first supply voltage and the second supply voltage to be controlled. The first transistor may e.g. be a p-type transistor configured to connect the intermediate node to the first supply voltage when low voltage, being below a threshold voltage of the first transistor, is applied by the first word line. Accordingly, the second transistor may be an n-type transistor configured to connect the intermediate node to the second supply voltage when a high voltage, exceeding a threshold voltage of the second transistor, is applied by the second word line. The first word line may be used for pulling both the first and the second intermediate node to a high voltage state, i.e., to the first supply voltage, and the second word line may be used for pulling both the first and the second intermediate node to a low voltage state, i.e., to the second supply voltage.

The complementary pairs of transistors for selectively connecting the first and second intermediate nodes to the first and the second supply voltages allow for a two-phase programming of the resistive memory elements.

In a first phase, the first and second word lines may be in a high voltage state turning the second transistors on, thereby connecting the first intermediate node and the second intermediate node to the second supply voltage source while disconnecting the intermediate nodes from the first supply voltage source. If there is a difference in potential between the first storage node of the bit cell and the second supply voltage source, this voltage may drive a current through the first resistive memory element, the first intermediate node, and the second transistor. Preferably, this current is large enough to switch the resistive state of the first resistive memory element to reflect the logic state of the first storage node. This logic state may correspond to a logic 1, or a high voltage state, allowing a current to flow from the first storage node. Correspondingly, if there is a difference in potential between the second storage node of the bit cell and the second supply voltage source, this voltage may drive a current through the second resistive memory element, the second intermediate node, and the second transistor. Preferably, this current is large enough to switch the resistive state of the second resistive memory element to reflect the logic state of the second storage node. This logic state may correspond to a logic 1, or a high voltage state allowing a current to flow from the second storage node.

In a second phase of the programming of the resistive memory elements, the first and second word lines may be in a low voltage state, turning the first transistors on to connect the first intermediate node and the second intermediate node to the first supply voltage source while disconnecting the intermediate nodes from the second supply voltage source. If there is a difference in potential between the first storage node of the bit cell and the first supply voltage source, this voltage may drive a current through the second transistor, the first intermediate node, and the first resistive memory element. Preferably, this current is large enough to switch the resistive state of the first resistive memory element to reflect the logic state of the first storage node. This logic state may correspond to a logic 0, or a low voltage state allowing the current to flow to the first storage node. Correspondingly, if there is a difference in potential between the second storage node of the bit cell and the first supply voltage source, this voltage may drive a current through the second transistor, the second intermediate node, and the second resistive memory element. Preferably, this current is large enough to switch the resistive state of the second resistive memory element to reflect the logic state of the second storage node. This logic state may correspond to a logic 0, or a low voltage state allowing the current to flow to the second storage node.

It is noted that the programming of the logic state of the SRAM bit cell into the first and second resistive memory elements may be performed by activating the SRAM bit cell word line to connect the storage nodes to their respective bit line. Thus, the current necessary for switching the resistive memory elements may be supplied by the bit lines. In this case, data may be retained into the resistive memory elements irrespectively of the powering of the SRAM bit cell, i.e., irrespectively of whether the SRAM bit cell is connected to an SRAM bit cell supply voltage or not. Alternatively, the SRAM bit cell may be disconnected from the first and second bit lines during the programming of the resistive memory elements. In such case, the SRAM bit cell may be powered so as to provide the potential difference required for switching the resistive memory elements.

The resistive memory elements allow for a memory cell in which the logic state of the SRAM bit cell may be retained in case power is removed from the SRAM bit cell. Thus, data may be stored in the resistive memory elements as the SRAM bit cell is disconnected from power, and restored into the SRAM bit cell when power is available again.

The advantages of certain aspects and embodiments may be illustrated by the following example, in which we assume that the storage cell stores a logic 1 (i.e., in which the first storage node may be at a high potential state compared to the second storage node, which may be assumed to be at a zero potential). It will however be understood that the operation and benefits of the present memory cell are equally applicable in case the storage cell stores a logic 0. For brevity, only the first case (logic 1) will be discussed in detail in the following.

Firstly, certain aspects and embodiments allow for an increased discriminability of the states of the first storage node and the second storage node during the programming of the resistive memory elements. This may be understood by comparing the momentaneous (or instantaneous) potential at the first and second storage node, respectively, during the programming.

Turing to the first storage node, a current path may in the first phase of the programming be opened between the first storage node and the second supply voltage source (which e.g. may be at a zero potential). This current may cause the potential of the first storage node to be at least temporarily reduced compared to the potential at the second storage node.

Turning to the second storage node, a current path may in the second phase of the programming be opened between the second storage node and the first supply voltage source (which e.g. may be at the same potential as the supply voltage source of the storage cell). The potential difference may be reduced by a current flowing towards the second storage node, at least temporarily increasing the potential of the second storage node as compared to the potential at the first storage node.

Generally, relatively small reductions in potential difference between the first storage node and the second storage node may be recovered due to the inherent bi-stable characteristics of the storage cell. This means that a temporary potential reduction at a storage node may be remedied by the positive feedback loop provided by the cross-coupled inverters. However, if the potential difference (or, in other words, the discriminability) between the storage nodes becomes too low, the storage cell risks to flip over to the other bi-stable state. By separating the programming of the respective resistive memory elements in time, i.e., in two separate phases, the reduction in potential at the first storage node may be separated in time from the increase in potential at the second storage node. This results in a reduced drop in potential difference and thus in an increased discriminability of the storage nodes.

Secondly, the two-phase programming of the resistive memory elements allows for a reduced power consumption, as a short-circuiting of the first supply voltage source and the second supply voltage source may be avoided during the programming phases. By applying a high voltage to both the first word line and the second word during the first phase of the programming, only the n-type of the complementary transistors may turn into a conducting state. The p-type transistor may be turned off, thus preventing a current to flow between the supply voltage sources. Similarly, by applying a low voltage to both word lines, only the p-type transistor may be turned on, leaving the n-type transistor turned off to prevent a short-circuiting.

Further, certain aspects and embodiments allow for each resistive memory element to be individually connected to the second supply voltage (or ground), which, in other words, may be local in respect of each memory cell. Thus, the current used for programming the resistive memory elements may flow from the storage node, through the resistive memory element and the intermediate node, and end at a local ground (or second supply voltage) of the memory cell. This is advantageous over technologies wherein both resistive memory elements of the memory cell are connected to a common driver, which in turn may be common to an entire array of memory cells. In such case, the total length and thus the electric resistance of the current path may be determined by the size of the array. The aspects and embodiments are advantageous over such technologies, as they may provide a current path having a reduced (and well defined) length and thereby a facilitated programming of the resistive memory elements.

The aspects and embodiments further allow for a memory cell having a reduced soft error rate (SER) during the restoring of data to the storage cell. Due to the floating configuration of the intermediate nodes, the effective capacitance of the first and second storage nodes may be increased. This reduces the risk of changes to the data stored by the memory cell, which is of particular interest in connection with applications relating to e.g. the space, automotive and defense industries.

The term resistive memory element may refer to an element that is programmable to adopt one of a plurality of different resistive states. The programmed resistive state may be maintained even when a supply voltage of the memory cell is disconnected, and therefore data may be stored by such elements in a non-volatile fashion. Preferably, the resistive memory element is capable of being programmed by the direction of a current that is passed through the resistive memory element.

An example of such a current-programmable resistive element is an STT (spin transfer torque) element, which may be based on magnetic tunnelling junctions (MTJs). The MTJ is an example of a storage element that may be formed from two magnetic layers, such as e.g. ferromagnetic layer, separated by a tunnelling layer. One of the two ferromagnetic layers, which may be referred to as the fixed or pinned layer, may have a magnetisation that is fixed in a particular direction. The other one of the two ferromagnetic layers, which may be referred to as the free layer, may have a magnetisation direction that can be altered to two different states. The different states of the free layer may be used to represent either a logic "1" or a logic "0". In particular, the electrical resistance of an MTJ may depend on whether the free layer magnetisation and fixed layer magnetisation are parallel or anti-parallel with each other. The parallel state may be associated with a logic "1", i.e., a low resistance state wherein the free layer magnetisation of the MTJ may be parallel to the fixed layer magnetisation of the MTJ. Accordingly, the anti-parallel state may be associated with a logic "0", i.e., a high resistance state in which the free layer magnetisation of the MTJ may be anti-parallel to the fixed layer magnetisation of the MTJ. The MTJs may be provided with an in-plane magnetic anisotropy or a perpendicular magnetic anisotropy (PMA).

The programming operation of the resistive memory elements may refer to the process of retaining the data of the SRAM bit cell in the resistive memory elements by changing or flipping the resistance level of the memory elements, such as the MTJs, from the high-resistance state to the low-resistance state and vice versa. The resistance level may be changed by passing a sufficiently high current, or write current (which also may be referred to as a programming current), through the MTJ. The lowest current required for switching may also be referred to as critical write current. Typically, the critical write current is higher for the parallel to anti-parallel (P2AP) switch than for the anti-parallel to parallel (AP2P) switch.

The restoring operation of the SRAM bit cell refers to the process of transmitting the retained data stored by the resistance level of the first and second resistive memory elements to the SRAM bit cell. More specifically, the restoring process may refer to the method wherein a current path is opened between the first supply voltage and the respective storage nodes of the storage cell. Due to the complementary states of the first and second resistive memory elements (resulting from the two-phase programming discussed above), the storage node connected to the resistive element being in the low resistance state may be charged faster than the storage node connected to the resistive element being in the high resistance state. Thus, a potential difference will be provided between the storage nodes of the storage cell, which due to the positive feedback mechanism of the SRAM storage cell may drive the storage cell into the correct logic state.

The voltage applied to the word lines for controlling the complementary transistors connecting the intermediate nodes to the first and second supply voltages may be of such a level that the gate voltage of the n-type transistors is shifted from a voltage which is smaller than the threshold voltage of the n-type transistor to a ("high-level") voltage which is equal to or greater than the threshold voltage of the n-type transistor. Correspondingly, the voltage applied to said word lines may be of such a level that the gate voltage of the p-type transistors is shifted from a voltage which is higher than the threshold voltage of the p-type transistor to a ("low-level") voltage which is equal to or lower than the threshold voltage of the p-type transistor. Thus, by the "high-level" voltage and the "low-level" voltage is hereby meant two different voltage levels, both being capable of turning on the n-transistors and the p-transistor, respectively.

The transistors referred to in the present disclosure may be n- and p-type field-effect transistors (FETs), such as e.g. metal-on-semiconductor FETs (MOSFETs). The transistors may e.g. be FinFETs or a nanowire transistors.

It is noted that the present concepts relate to all possible combinations of features recited in the claims. Further, it will be appreciated that the various embodiments described for the memory cell according to the first aspect are all combinable with embodiments described for each of the methods according to the second and third aspects. Even though the examples discusses 6 transistor SRAMs, other SRAM configurations, e.g. using more than 6 transistors, are equally conceivable and possible to combine with the resistive memory elements and the intermediate nodes as described above.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

All the figures are schematic, not necessarily to scale, and generally only show parts which are necessary to elucidate embodiments of the present inventive concept, wherein other parts may be omitted or merely suggested.

DETAILED DESCRIPTION OF PREFERRED EMBODIMENTS

Detailed embodiments of the present inventive concept will now be described with reference to the drawings. The present inventive concept may, however, be embodied in many different forms and should not be construed as limited to the embodiments set forth herein; rather, these embodiments are provided by way of example so that this disclosure will convey the scope of the inventive concept to those skilled in the art.

Figure 1:
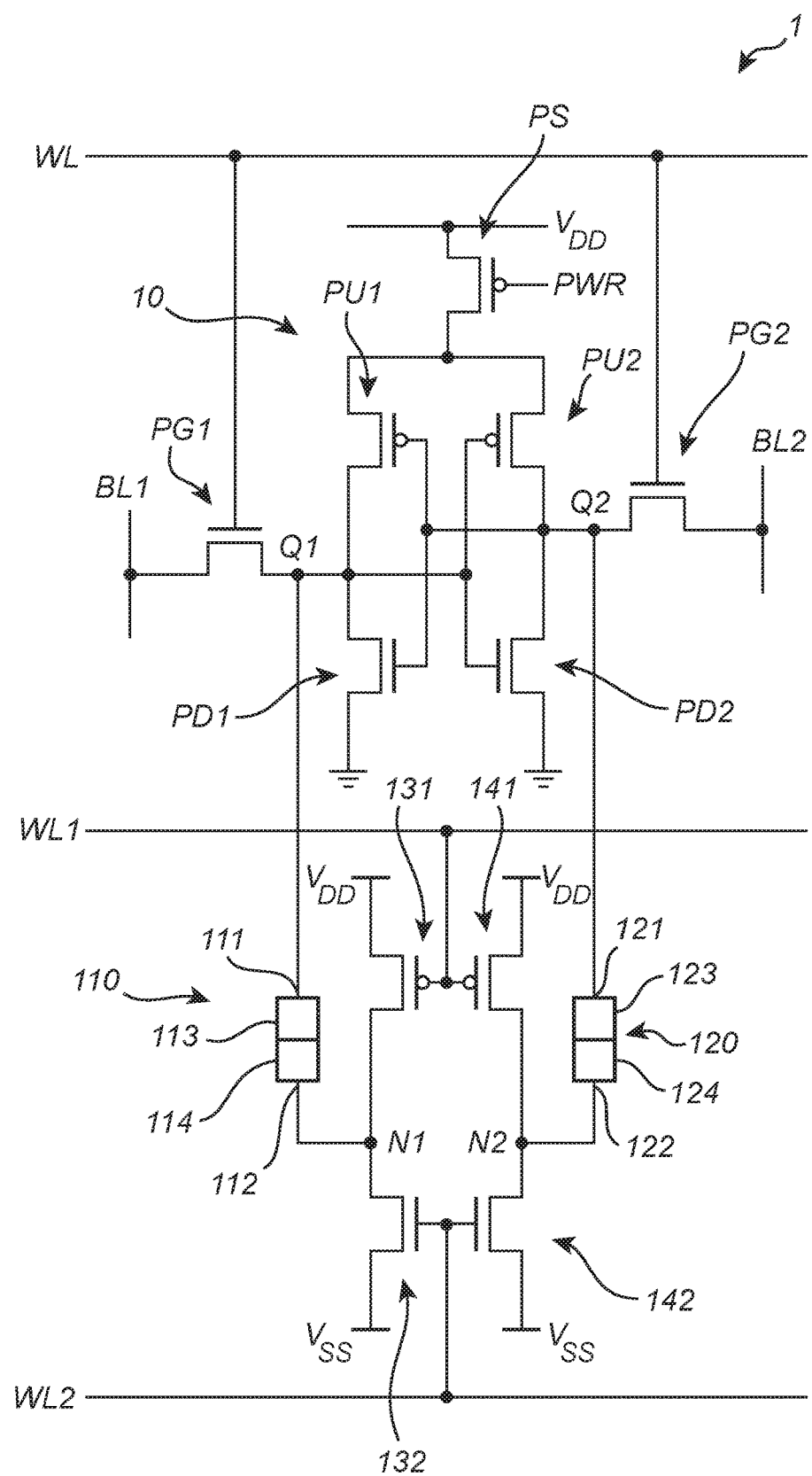
FIG. 1 shows a circuit schematic of a memory cell comprising an SRAM storage cell and resistive memory elements.

With reference to FIG. 1, a memory cell 1 is shown in the form of a circuit schematic. The memory cell 1 may comprise an SRAM bit cell 10, comprising e.g. four transistors PU1, PU2, PD1, PD2 arranged in two cross-coupled inverters so as to form a bi-stable storage cell. Conventionally, PU1 and PU2 may be referred to a pull-up transistors or p-type transistors (such as e.g. pFETS), and may be connected to the pull up (or positive) supply rail or supply voltage $V_{DD}$. PD1 and PD2 may be referred to as pull-down transistors or n-type transistors (such as e.g. nFETs), and may be connected to a pull down (or low voltage) supply rail or supply voltage $V_{SS}$. As indicated in the example of the present figure, the pull down transistors PD1, PD2 may be connected to ground. The first pull up transistor PU1 and the first pull down transistor PD1 may form a first CMOS structure or inverter, whereas the second pull up transistor PU2 and the second pull down transistor PD2 may form a second CMOS structure or inverter. As seen in FIG. 1, the inverters may be cross-coupled in a first storage node Q1 and a second storage node Q2. As the storage nodes are complementary nodes, the electric potential at the respective storage nodes Q1, Q2 may represent the logic state of the SRAM bit cell 10. A high potential at the first storage node Q1 and a low (such as a zero) potential at the second storage node Q2 may e.g. represent a logic "1", whereas the opposite potential distribution may represent a logic "0".

The SRAM bit cell 10 may further comprise a first access transistor PG1 for controlling the access to the first storage node Q1. Similarly, a second access transistor PG2 may be provided for controlling the access to the second storage node Q2. The access transistors PG1, PG2 may also be referred to as pass transistors or pass gates. The access transistors may e.g. be nFETs or pFETs controlled by an SRAM bit cell wordline WL connected to the gate terminal of the respective transistors PG1, PG2. Data may be written to the storage cell by applying an access voltage to the word line WL such that access transistors PG1, PG2 connect the storage nodes Q1, Q2 to a respective first and a second bit line BL1, BL2. The bit lines BL1, BL2 may be complementary so as to draw the storage cell into the desired logic state (i.e., 1 or 0).

The SRAM bit cell 10 may further comprise a supply voltage transistor PS for controlling the connection between the pull up transistors PU1, PU2 and the SRAM bit cell supply voltage $V_{DD}$. The powering of the storage cell may be regulated by a word line PWR connected to a gate terminal of the supply voltage transistor PS. Thus, the supply voltage transistor PS may act as a switch turning on and off the storage cell.

The memory device 1 may further comprise a non-volatile storage circuit, formed by two pairs of complementary transistors 131, 132; 141, 142 and a first and a second resistive memory element 110, 120. Each pair of complementary transistors may be connected in series between a first supply voltage source $V_{DD}$ and a second supply voltage source $V_{SS}$, or a ground potential. The first and second transistor 131, 132, 141, 142 of each pair may be connected to each other in a respective intermediate node, such as a floating first intermediate node N1 and a floating second intermediate node N2. Thus, the potential of the intermediate nodes N1, N2 may be determined by the transistors connected to the respective nodes. As indicated in the present figure, the first intermediate node N1 may be connected to a pFET 131 and a nFET 132 and the second intermediate node N2 to pFET 141 and nFET 142. The first and second intermediate nodes N1, N2 may thus be connected to the first supply voltage $V_{DD}$ through transistors 131, 141, which may be controlled via a common first word line WL1. Further, the first and second intermediate nodes N1, N2 may be connected to the second supply voltage $V_{SS}$ thought transistors 132, 142, which may be controlled via another, second word line WL2.

The first resistive memory element 110 may be connected between the first storage node Q1 and the first intermediate node N1, wherein the second resistive memory element 120 may be be connected between the second storage node Q2 and the second intermediate node N2. As shown in the present figure, the resistive storage elements 110, 120 may be directly connected to the respective storage node Q1, Q2, i.e., without any intermediate components such as e.g. transistors.

The resistive memory elements 110, 120 may e.g. comprise MTJs, which may be programmable by a current to assume a high resistive state or a low resistive state. The MTJs 110, 120 may comprise two ferromagnetic layers, such as a pinned or fixed layer 114, 124 and a free layer 113, 123 separated by a tunnelling layer (not shown). The fixed layer 114, 124 may have a magnetisation that is fixed in a particular direction whereas the magnetisation of the free layer 113 may be altered by e.g. a write current passing through the MTJ 110, 120. The direction of the magnetisation of the pinned layer 114, 124 and the free layer 113, 123 may be parallel with each other or anti-parallel. The electrical resistance of the MTJ 110, 120 may be lower for a parallel magnetisation state and higher for an anti-parallel magnetisation state. The two different magnetisation states, or resistance states, may hence be used for storing either a logic "1" or a logic "0".

Figure 2:
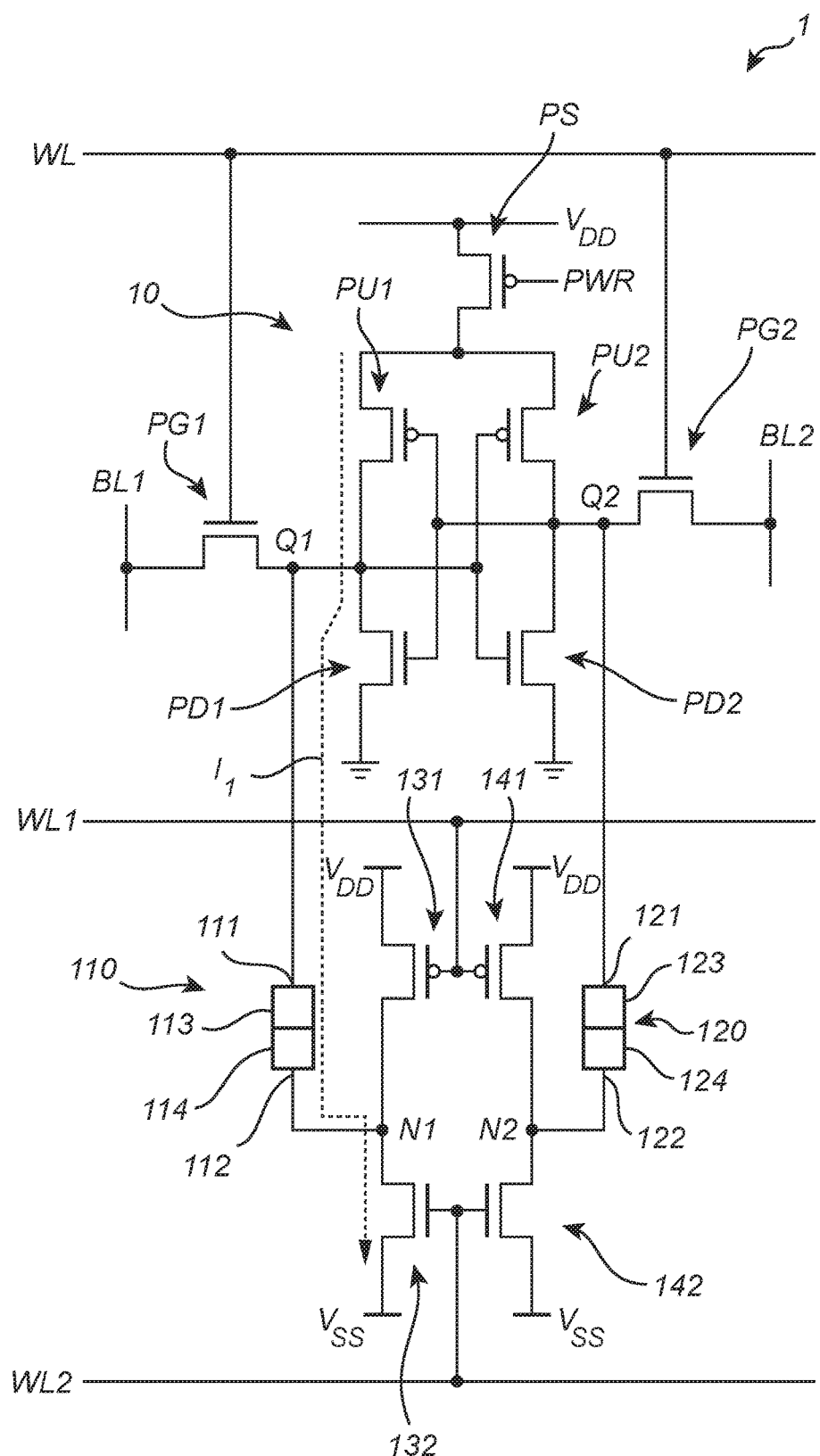
FIGS. 2 and 3 schematically depict current paths in a memory cell during the programming of the resistive memory elements.

FIG. 2 shows a memory cell 1 that may be similarly configured as the memory cell discussed above in connection with FIG. 1. FIG. 2 will now be used for illustrating the first phase of the programming of the resistive memory elements, or MTJs 110, 120. In the present example, the supply voltage transistor PS is turned on and the SRAM bit cell 10 hence connected to power rail $V_{DD}$. The storage cell is illustrated in a logic state that corresponds to the first storage node Q1 being at a high potential and the second storage node Q2 being at a low potential. Thus, the first storage node Q1 may be connected to supply voltage $V_{DD}$, and the second storage node to ground (or supply voltage $V_{SS}$, being lower than supply voltage $V_{DD}$). The access transistors PG1, PG2 are in this example switched off.

In the first phase of the programming, the first MTJ 110 may be switched into a low resistance or parallel (P) state by letting a switching current I1 flow between the first terminal 111 and the second terminal 112 of the MTJ 110. This may be achieved by applying a high-level voltage to the first and second word lines WL1, WL2, such that the first transistors 131, 141 (assuming are pFETs) are switched off and the second transistors 132, 142 (assuming they are nFETs) are turned on. Hence, the first and second intermediate nodes N1, N2 are connected to ground but not to the first supply voltage $V_{DD}$. Since the first storage node Q1 is at a high potential, this potential difference may induce a write current I1 through the first MTJ 110. Preferably, the MTJ 110 and the supply voltage $V_{DD}$ of the SRAM bit cell 10 are selected such that the current I1 is capable of switching the resistive state of the resistive memory element 110, i.e., to switch the magnetisation of the free layer 113 of the first MTJ 110 into the parallel, low resistance state. Thus, the high potential state at the first storage node Q1 has been transferred into a low resistance state of the first resistive memory element 110.

The potential difference between the second storage node Q2 and the second intermediate node N2 may be selected such that any current that may flow through the second MTJ 120 is too low to cause the second MTJ 120 to switch its resistive state. Preferably, both the second storage node Q2 and the second intermediate node N2 may be kept at a zero or close to zero potential.

Figure 3:
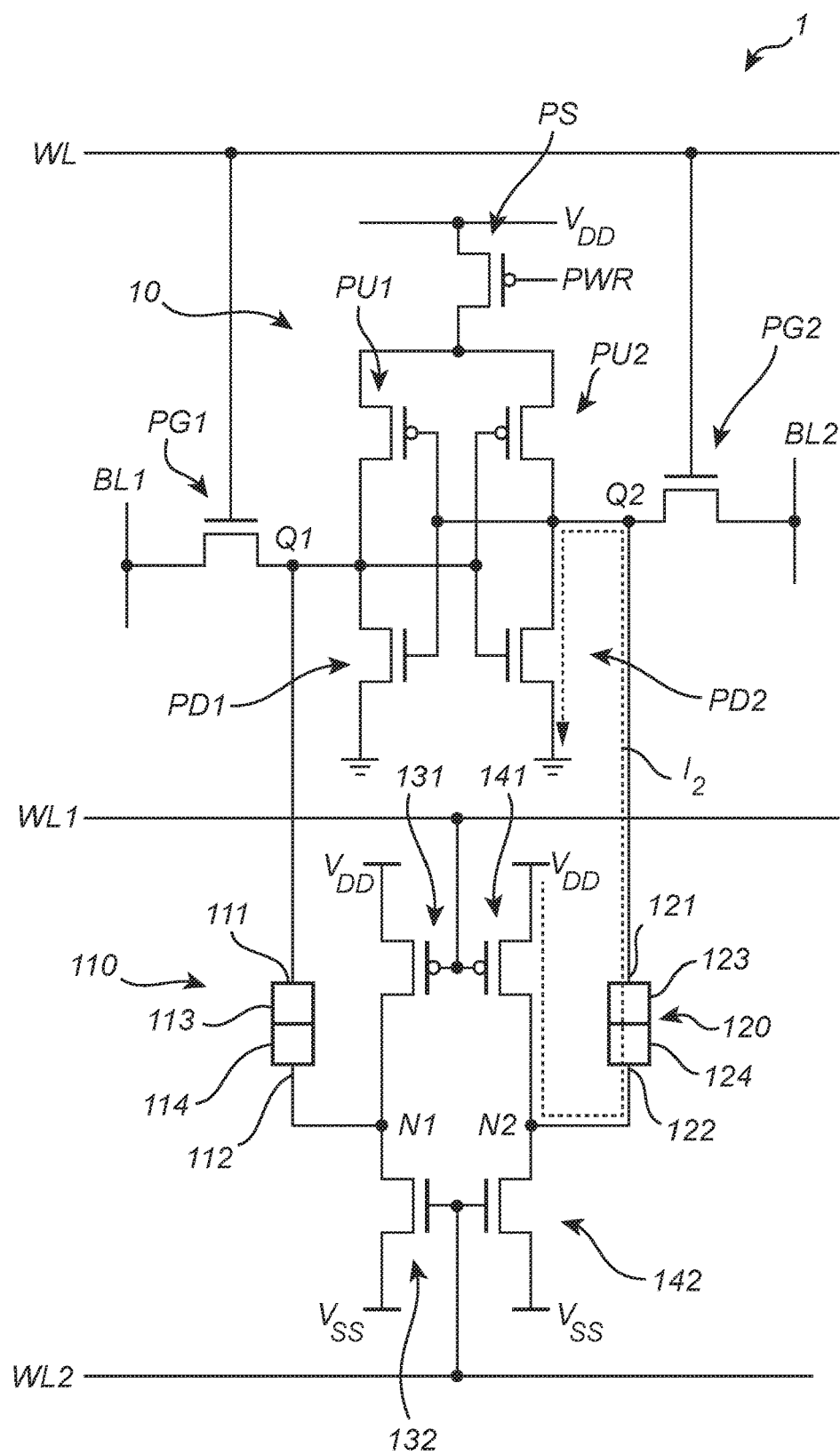

FIG. 3 shows the memory cell of FIG. 2, and will now be used for describing the second phase of the programming of the resistive memory elements 110, 120. In the present figure, it is assumed that the first phase has been performed such that the high potential state of the first storage node Q1 has been transferred into the first resistive memory element 110. In the subsequent step illustrated in the present figure, a low-level voltage may be applied to the first and second word lines WL1, WL2, turning on the first transistors 131, 141 and turning off the second transistors 132, 142. Thus, the first and second intermediate nodes N1, N2 are disconnected from ground and instead connected to the first supply voltage $V_{DD}$. As the second storage node Q2 is at a low (or zero) potential, the potential difference between the second intermediate node N2 and the second storage node Q2 may drive a write current I2 through the second MTJ 120. Preferably, the second MTJ 120 and the potential difference over the second MTJ 120 are selected such that the current I2 is capable of turning the resistive memory element 120 into a high resistance state, i.e., into a state of anti-parallel magnetisation of the free layer 123 of the second MTJ 120 such that the low potential state at the second storage node Q2 is transferred to the second resistive memory element 120.

Figure 4:
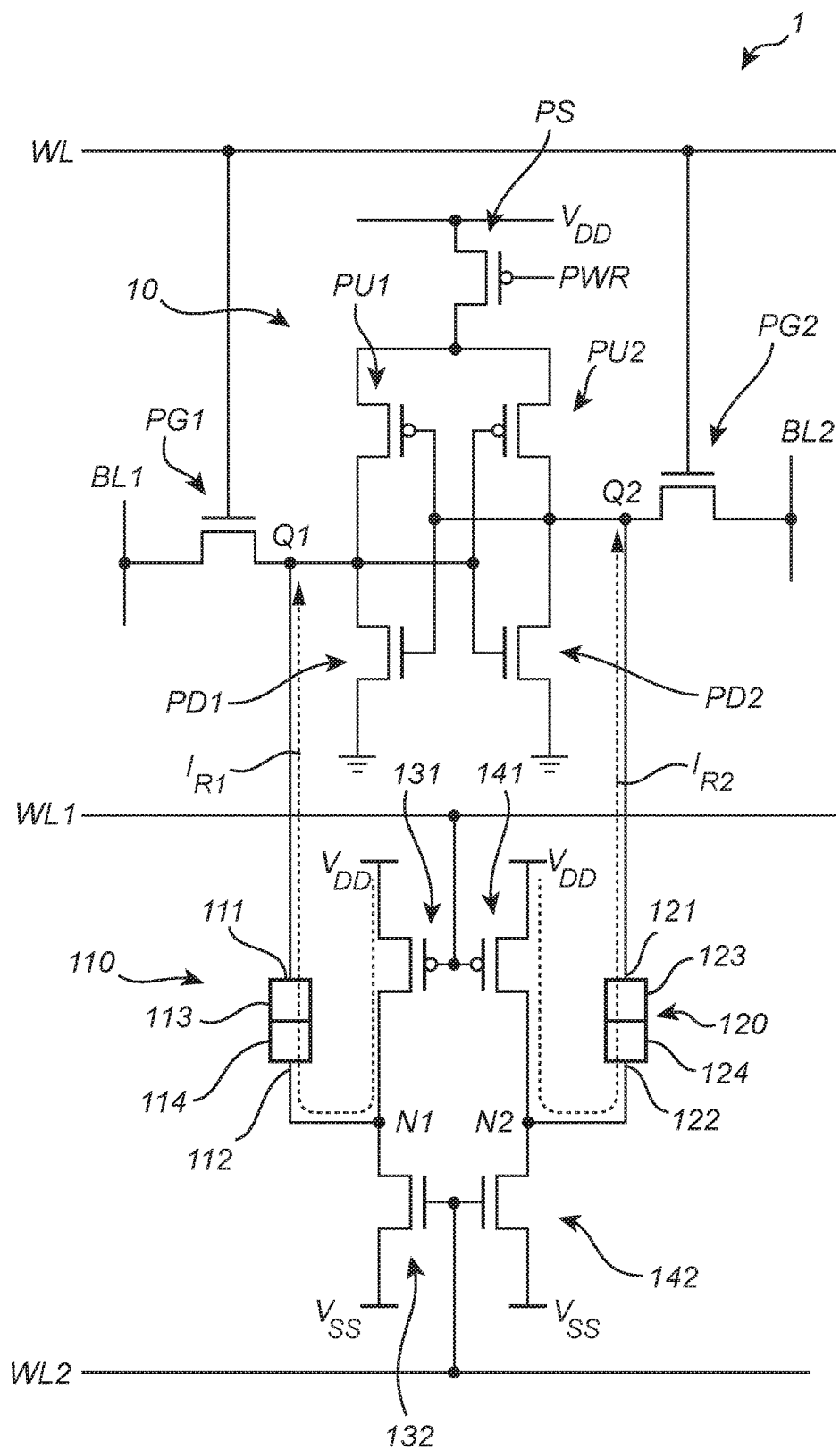
FIG. 4 shows current paths in a memory cell during restoring of the data of the storage cell.

A method for restoring non-volatile data stored in the first and second resistive memory elements to the volatile SRAM bit cell will now be discussed with reference to FIG. 4, which illustrates a memory cell 1 which may be similarly configured as the memory cells of FIGS. 1 to 3. Initially, the SRAM bit cell may be switched off, i.e., disconnected from the SRAM bit cell voltage supply rail $V_{DD}$, by means of the supply voltage transistor which may be in its non-conducting state. To transmit the data stored in the resistive state of the first and second resistive memory elements 110, 120, a low-level voltage may be applied to the first and second word lines WL1, WL2. This may cause the first transistors 131, 141 to connect the first and second intermediate nodes N1, N2 to the first supply voltage $V_{DD}$ and the second transistors 132, 142 to disconnect the intermediate nodes N1, N2 from ground (or second supply voltage $V_{SS}$). Thus, a current path $I_{R1}$, $I_{R2}$ may be opened between the first supply voltage $V_{DD}$ and the first and second storage nodes Q1, Q2, the first current path $I_R$, passing through the first resistive memory element 110 and the second current path $I_{R2}$ passing through the second resistive memory element 120. Depending on the resistive state of the first and second resistive memory elements 110, 120, the storage node connected to the resistive memory element 110, 120 having the lower resistance may charge faster than the other storage node Q1, Q2. Assuming that the first resistive memory element 110 illustrated in FIG. 1 is in the low resistance state (and, accordingly, that the second resistive memory element 120 is in the high resistance state), the first storage node Q1 may be driven towards the first supply voltage $V_{DD}$ faster than the second storage node Q2. At this state, the inherent positive feedback of the storage cell may kick in, pushing the bi-stable storage cell into the state corresponding to the first storage node Q1 having a high potential and the second storage node Q2 having a low potential. The voltage transistor PS may now be turned on, connecting the SRAM bit cell 10 to power rail $V_{DD}$.

Subsequently, a high level voltage may be applied to the first word line WL1 to turn off also the first transistors 131, 141, thereby disconnecting the first and second resistive memory elements 110, 120 from the first supply voltage $V_{DD}$ and the second supply voltage $V_{SS}$. Thus, the current paths between the first and second storage nodes Q1, Q2 and the first and second intermediate nodes N1, N2, respectively, are disconnected. This allows for the SRAM bit cell 10 to assume a normal operation mode, i.e., a standby mode, reading mode or writing mode without being disturbed by the resistive memory elements 110, 120. In the standby mode, the access transistors PG1, PG2 may disconnect the SRAM bit cell 10 from the first and second bit lines BL1, BL2. In the reading/writing mode, the SRAM bit cell 10 may be accessed through the access transistors PG1, PG2 by applying a high level voltage to the SRAM bit cell word line WL such that the first and second storage nodes Q1, Q2 may be accessed for reading and writing operations through the bit lines BL1, BL2.

Figure 5:
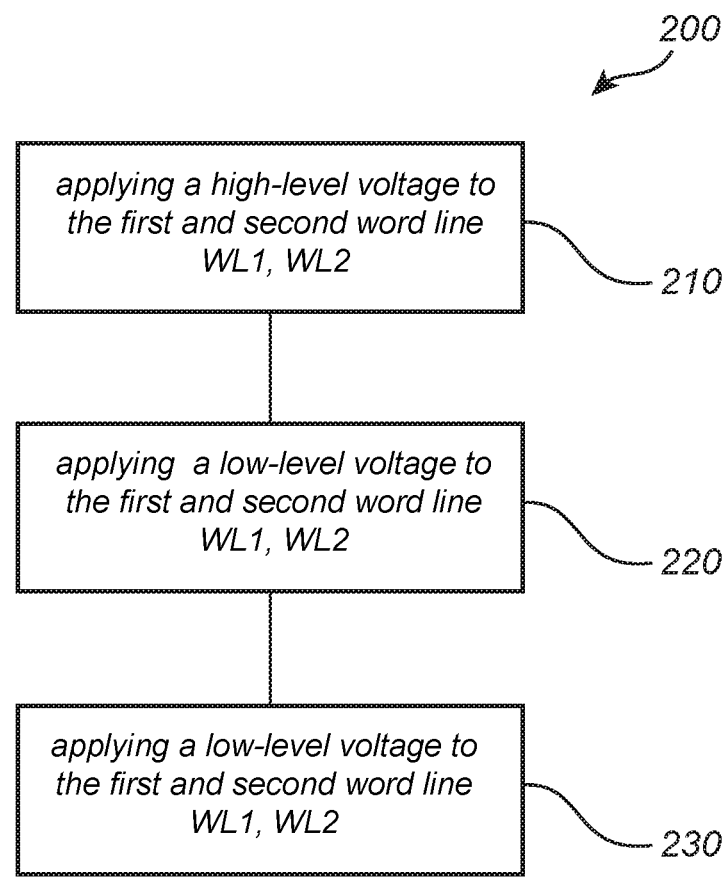
FIG. 5 is a flow chart illustrating methods in a memory cell.

FIG. 5 schematically depicts a method in a memory cell, which may be similarly configured as the memory cells discussed in connection with FIGS. 1 to 4. The method 200 may comprise the steps of applying 210 a high-level voltage to the first and second word line WL1, WL2 such that, in case the first storage node Q1 is in a high voltage state, a write current I1 flows from the first storage node Q1 to the second supply voltage source $V_{SS}$ such that the first resistive storage element 110 is switched to a low resistance mode, and, in case the second storage node Q2 is in a high voltage state, a write current I1 flows from the second storage node Q2 to the second supply voltage source $V_{SS}$ such that the second resistive storage element 120 is switched to a low resistance mode. The method may further comprise applying 220 a low-level voltage to the first and second word line WL1, WL2, such that, in case the second storage node Q2 is in a low voltage state, a write current I2 flows from the first voltage source $V_{DD}$ to the second storage node Q2 such that the second resistive memory element 120 is switched to a high resistance state, and, in case the first storage node Q1 is in a low voltage state, a write current I2 flows from the first voltage source $V_{DD}$ to the first storage node Q1 such that the first resistive memory element 110 is switched to a high resistance state. Subsequently, a low-level voltage may be applied 230 to the first and second word line WL1, WL2, such that the first and second storage node Q1, Q2 may be charged by a current flowing from the first voltage source $V_{DD}$, wherein, in case the first resistive memory element 110 is in a low resistance state and the second resistive memory element 120 is in a high resistance state, the first storage node Q1 is charged faster than the second storage node Q2, thereby causing the SRAM bit cell 10 to reinforce a state in which the first storage node Q1 is arranged at a high voltage state and the second storage node Q2 is arranged at a low voltage state and, in case the first resistive memory element 110 is in a high resistance state and the second resistive element 120 is in a low resistance state, the second storage node Q2 is charged faster than the first storage node Q1, thereby causing the SRAM bit cell 10 to reinforce a state in which the first storages node Q1 is arranged at a low voltage state and the second storage node Q2 is arranged at a high voltage state.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

The invention claimed is:

1. A memory cell, comprising:
    a static random-access memory bit cell;
    a first resistive memory element having a first terminal connected to a first storage node of the static random-access memory bit cell and a second terminal connected to a first intermediate node; and
    a second resistive memory element having a first terminal connected to a second storage node of the static random-access memory bit cell and a second terminal connected to a second intermediate node; wherein
    each one of the first intermediate node and the second intermediate node is configured to be supplied with a first supply voltage via a first transistor and a second supply voltage via a second transistor; and wherein
    the first transistor and the second transistor are each complementary transistors separately controllable by a first word line and a second word line, respectively.

2. The memory cell according to claim 1, wherein the resistive memory elements are magnetic tunnel junction elements.

3. The memory cell according to claim 2, wherein the first terminal is connected to a free layer of the magnetic tunnel junction element.

4. The memory cell according to claim 1, wherein the first transistor and the second transistor are field-effect transistors.

5. The memory cell according to claim 4, wherein the first transistor is an n-type field-effect transistor and the second transistor is a p-type field-effect transistor.

6. The memory cell according to claim 1, wherein the static random-access memory bit cell comprises a first access transistor coupled between the first storage node and a first bit line and a second access transistor coupled between the second storage node and a second bit line, wherein the first access transistor and the second access transistor are each p-type field-effect transistors.

7. The memory cell according to claim 1, wherein the static random-access memory bit cell further comprises a supply voltage transistor, coupled between a bit cell supply voltage and the static random-access memory bit cell, wherein the supply voltage transistor is configured for powering on or off the static random-access memory bit cell.

8. The memory cell according to claim 1, wherein the second transistor is connected to ground.

9. A method for programming a first and a second resistive memory element of a memory cell, comprising:
    providing the memory cell according to claim 1;
    applying a high-level voltage to the first word line and the second word line, wherein the high-level voltage is higher than a threshold voltage of the second transistor such that:
        in case the first storage node is in a high voltage state, a current flows from the first storage node to the second supply voltage source such that the first resistive storage element is switched to a low resistance mode; and
        in case the second storage node is in a high voltage state, a current flows from the second storage node to the second supply voltage source such that the second resistive storage element is switched to a low resistance mode;

applying a low-level voltage to the first and second word line, wherein the low-level voltage is lower than a threshold voltage of the first transistor such that:

in case the second storage node is in a low voltage state, a current flows from the first voltage source to the second storage node such that the second resistive memory element is switched to a high resistance state; and in case the first storage node is in a low voltage state, a current flows from the first voltage source to the first storage node such that the first resistive memory element is switched to a high resistance state.

10. A method for restoring data in a static random-access memory bit cell, comprising:

providing the memory cell according to claim 1;

applying, when the static random-access memory bit cell is disconnected from power, a low-level voltage to the first and second word line, wherein the low-level voltage is lower than a threshold voltage of the first transistor such that the first and second storage node are charged by a current flowing from the first voltage source; wherein in case the first resistive memory element is in a low resistance state and the second resistive memory element is in a high resistance state, the first storage node is charged faster than the second storage node, thereby causing the static random-access memory bit cell to reinforce a state in which the first storage node is arranged at a high voltage state and the second storage node is arranged at a low voltage state; and in case the first resistive memory element is in a high resistance state and the second resistive element is in a low resistance state, the second storage node is charged faster than the first storage node, thereby causing the static random-access memory bit cell to reinforce a state in which the first storages node is arranged at a low voltage state and the second storage node is arranged at a high voltage state; and there after connecting the static random-access memory bit cell to power.

11. The method according to claim 10, further comprising subsequent steps of:

applying a high-level voltage to the first word line such that the first and second intermediate nodes are disconnected from the first supply voltage;

maintaining the low-level voltage to the second word line such that the first and second intermediate nodes are disconnected from the second supply voltage; and then applying a high voltage to an static random-access memory bit cell word line such that the first and second storage nodes are connected to a first and a second bit line, respectively, for writing data to the static random-access memory bit cell and/or reading data from the static random-access memory bit cell.

* * * * *